(12) United States Patent
Jadcherla

(10) Patent No.: US 7,340,696 B1
(45) Date of Patent: Mar. 4, 2008

(54) AUTOMATED DESIGN PROCESS AND CHIP DESCRIPTION SYSTEM

(75) Inventor: Srikanth Jadcherla, Campbell, CA (US)

(73) Assignee: Archpro Design Automation, Inc., Mountain View, CA (US)

( * ) Notice: Subject to any disclaimer, the term of this patent is extended or adjusted under 35 U.S.C. 154(b) by 318 days.

(21) Appl. No.: 11/180,139

(22) Filed: Jul. 12, 2005

Related U.S. Application Data (60) Provisional application No. 60/589,403, filed on Jul. 19, 2004.

(51) Int. Cl.
*G06F 17/50* (2006.01)
(52) U.S. Cl. ........................ 716/1; 716/5; 716/7; 716/10
(58) Field of Classification Search .................... 716/1, 716/5, 7, 10
See application file for complete search history.

(56) References Cited

U.S. PATENT DOCUMENTS

| | | | | |
|---|---|---|---|---|
| 5,218,551 A | * | 6/1993 | Agrawal et al. | 716/10 |
| 5,576,965 A | * | 11/1996 | Akasaka et al. | 700/97 |
| 5,907,494 A | * | 5/1999 | Dangelo et al. | 703/1 |
| 6,421,818 B1 | * | 7/2002 | Dupenloup et al. | 716/18 |
| 6,836,877 B1 | * | 12/2004 | Dupenloup | 716/18 |
| 7,146,586 B2 | * | 12/2006 | Bohl et al. | 716/4 |
| 2002/0186246 A1 | * | 12/2002 | Burnette et al. | 345/771 |

* cited by examiner

*Primary Examiner*—Sun James Lin
(74) *Attorney, Agent, or Firm*—Park, Vaughan & Fleming LLP (57) ABSTRACT

An automated design process and chip description system is disclosed. The automated design process and chip description system compensates for the loss in design information that occurs when the design is represented in traditional functional descriptions. The automated design process includes the steps of processing a design definition according to a functional description and generating a modified design output such that communication between design process steps is seamless. The chip description system comprises a storage element and a functional element, wherein a first design object couples to a second design object such that the coupling uses at least one functional element to access one or more storage elements usable by the chip description system. A data structure for use in a chip description system is also disclosed and comprises a plurality of design objects, a plurality of tool objects interactively coupled with the design objects, a plurality of process objects interactively coupled with the tool objects and the design objects, a plurality of people objects interactively coupled with the process objects, the design objects and the tool objects, wherein the interactive coupling provides improved data management for a plurality of design files.

25 Claims, 9 Drawing Sheets

```
Power_net
indicator = <signal_name>;
legal_values = {list};
standby_voltage = {list};
    good2down = <value>; // power "assertions"
    up2good = <value>;
    good2rst = <value>;
rstsignals = {list};
grid = {DEF/PDEF fragment};
    decap = <value>;
    IR_drop_max = <value>;
    max_di_dt = <value>;

method calculate_decap (grid segment, grid cap, max_di_dt) {
    <code links to tool objects>
}
```

```
Eda_tool
    exec_name = <value>;
      version = <value>;
      lic_file = <value>;
     init_file = <value>;
       options = <value>;
       logfile = <design objects>;
  source_files = <design objects>;
       outputs = <design objects>;
    method run {
        exec_name <options> <version> <logfile>
        <source_files> ...
    }
```

611 — Eda_tool
621 — attributes
631 — method run

| eco | changed_modules = <design objects>;<br>approval_list = <people objects><br>exec = <tool object>;<br>bug_number = <design object>; | method run_eco {<br>  <code connects tool object from here><br>} |
| --- | --- | --- |
| 712 | 722 | 732 |

AUTOMATED DESIGN PROCESS AND CHIP DESCRIPTION SYSTEM

RELATED APPLICATIONS

This application claims priority to Provisional Application Ser. No. 60/589,403, filed Jul. 19, 2004, the benefit of the filing date of which is hereby claimed under 35 U.S.C. §119(e).

BACKGROUND

1. Field

This invention relates to the art of electronic design automation (EDA), and more specifically to an automated design process and chip description system.

2. Related Art

In the art of semiconductor chip design, tools such as electronic design automation (EDA) are used to provide a means for automating the design of Integrated Circuits (IC) and Systems on a Chip (SoC) so that the design can be tested prior to the expensive process of implementing the design in silicon. Tools are also provide a means of automating the task(s) of preparing the design for manufacture on silicon.

Hardware Description Languages (HDL) are used to model a chip and its functions. Existing HDL technology places the main functional description of Integrated Circuits (IC) and Systems on a Chip (SoC) in Register Transfer Language (RTL) source files.

The RTL source files do not include information about various non-functional aspects of the design. Such non-functional aspects include clock rates, etc. Non-functional aspects of the design are typically described in constraint (input/output) files and scripts; text documents and email messages; oral communications between design team members and other members of the project team; tags; spreadsheets; and programs, formats and databases that are not necessarily directly connected to the databases that are used for implementation and verification.

What is needed is a system and method that compensates for the loss in design information that occurs when the design is represented in traditional functional descriptions.

SUMMARY

An automated design process and chip description system is disclosed. The automated design process and chip description system compensates for the loss in design information that occurs when the design is represented in traditional functional descriptions.

The automated design process includes the steps of processing a design definition according to a functional description and generating a modified design output such that communication between a plurality of design process steps is seamless. The modified design output can include a plurality of physical attributes or non-physical attributes. The plurality of physical attributes can include electrical characteristics, mechanical characteristics, thermal characteristics, packaging characteristics, and manufacturing characteristics. The plurality of non-physical attributes can include cost criteria or scheduling criteria. The modified design output can include a plurality of architectural objects, micro-architectural objects. The modified design output can also be a transparent user-creatable object space. The transparent user-creatable object space can provide a means for communicating with a plurality of design database objects, such that design process customization is improved. The transparent user-creatable object space can also include a plurality of predefined complex design objects, where the predefined complex design objects can be applied in a consistent manner across an Integrated Circuit development cycle. The predefined complex design objects can include clocks, test structures, interfaces, power wells, power (voltage) islands, and current information. The step of generating a modified design output can be adjustable in accordance with a plurality of predefined workflow parameters, predefined project management parameters, predefined project management parameters. The step of generating a modified design output can further comprise generating a plurality of internal design elements, wherein the plurality of internal design elements are interactively coupled with one another. The plurality of internal design elements can be associated with a plurality of analytical tasks, management tasks, or modification tasks.

The chip description system comprises a storage element and a functional element, wherein a first design object couples to a second design object such that the coupling uses at least one functional element to access one or more storage elements usable by the chip description system. A data structure for use in a chip description system is also disclosed and comprises a plurality of design objects, a plurality of tool objects interactively coupled with the design objects, a plurality of process objects interactively coupled with the tool objects and the design objects, a plurality of people objects interactively coupled with the process objects, the design objects and the tool objects, wherein the interactive coupling provides improved data management for a plurality of design files.

DETAILED DESCRIPTION

The following serves as a glossary of terms as used herein:

CDS: Chip Description Language, as described below in this detailed description.

Constraints: commands used along with the RTL as inputs to various execution engines to provide additional specification not contained in the RTL.

Design tasks: tasks that are relevant for the implementation and verification of a design.

DFM: Design for Manufacturing, a rule and process set aimed at avoiding and reducing manufacturing errors.

DRC: Design Rule Checking, a process by which rules to ensure the safe realization of a design are checked.

LVS: Layout Verification to Schematic, a process by which polygon representations of the hardware are verified against a connectivity description.

Methods: procedures or functions that are declared and called by objects.

Object: An "object" is a collection of data fields (storage elements) and methods (associated functions). In the case of this invention, objects are used to model the properties of an Integrated circuit as well as its development by people, tools (programs) and processes.

Process: A process is a special object that is primarily used to create/modify/transform design data that may be stored in the data fields of objects or otherwise. A process has "input" data fields and "output" data fields, not necessarily mutually exclusive.

RTL: Register Transfer Language, usually in Verilog/VHDL. RTL files contain a functional description of hardware that is executable by design automation tools. RTL may be subject to higher levels of abstraction in the future, to which the methods of this invention can apply.

RTL TO TAPEOUT: refers to the current EDA paradigm where a common design environment exists from RTL stage to shipping the design to the foundry in a format known as GDSII. This is sometimes referred to as RTL to GDSII or RTL2GDSII in trade publications and industry parlance.

SoC: System on a Chip, refers to a complex Integrated Circuit (IC) with varied circuit types in it.

Tools: refers generally to programs that accomplish or aid the automation of design tasks, for example, EDA tools or scripts that are used for IC design tasks.

uArch: Micro-Architecture, is planning for the detailed architecture of hardware; precedes RTL development and is a basis for partitioning the chip and deriving constraints.

An automated design process and chip description system (CDS) compensates for the loss in design information that occurs when the design is represented in traditional functional descriptions by including non-functional information that is useful for improving the productivity and for addressing risk problems.

This non-functional aspects include clock rates, etc. Non-functional aspects of the design are typically described in constraint (input/output) files and scripts; text documents and email messages; oral communications between design team members and other members of the project team; tags; spreadsheets; and programs, formats and databases that are not necessarily directly connected to the databases that are used for implementation and verification.

Figure 1:
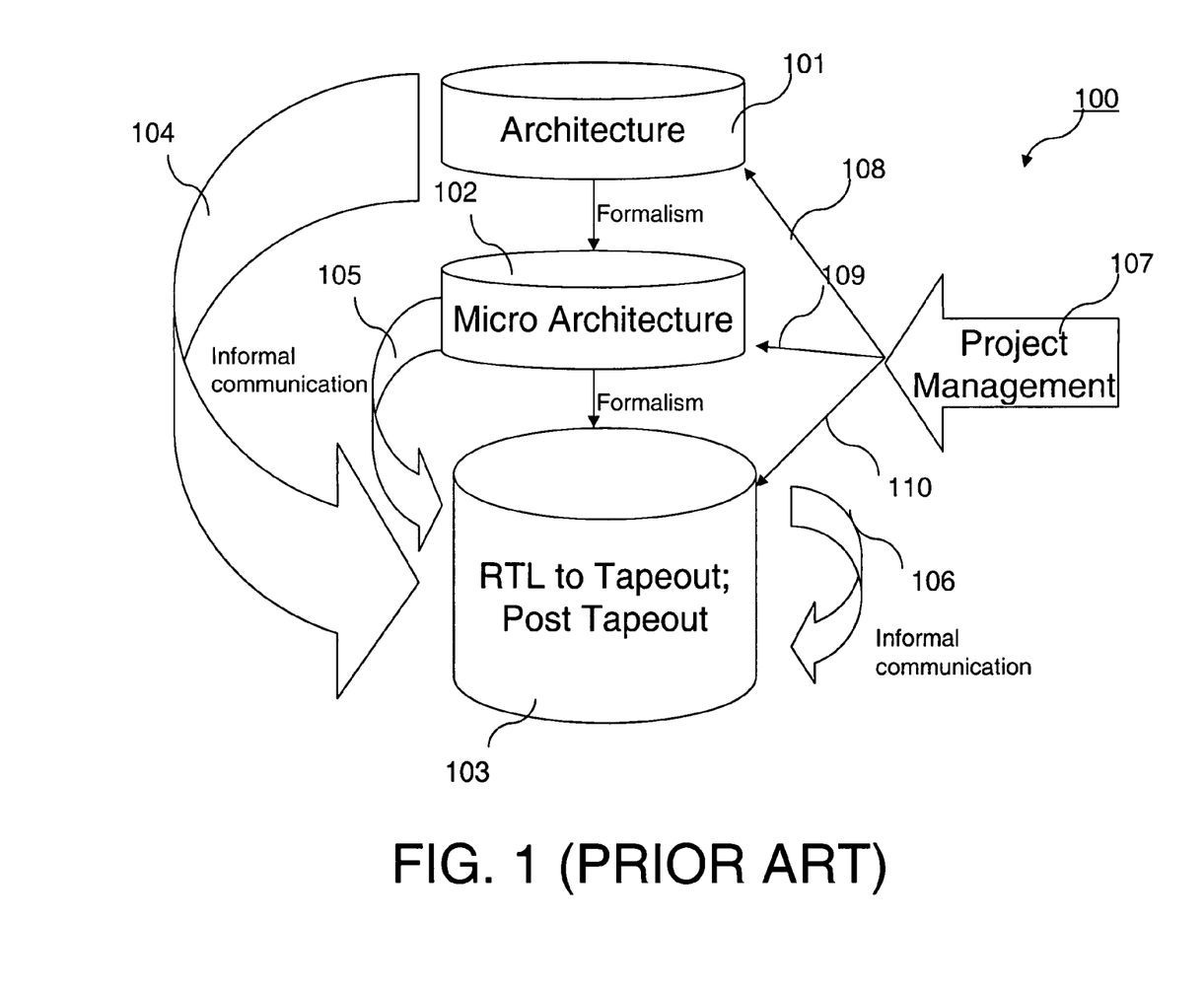
FIG. 1 is a block diagram showing a prior art automated design process.

FIG. 1 is a block diagram 100 showing a prior art automated design process. Formal interactions between an architecture 101 and a micro architecture 102, and between the micro architecture 102 and a common EDA environment called RTL TO TAPEOUT 103. Information communications among the architecture 101, micro architecture 102, and RTL TO TAPEOUT 103 are shown by arrows 104-106. Project management information 107 is introduced into the design environment by the paths shown by arrows 108-110.

Figure 2:
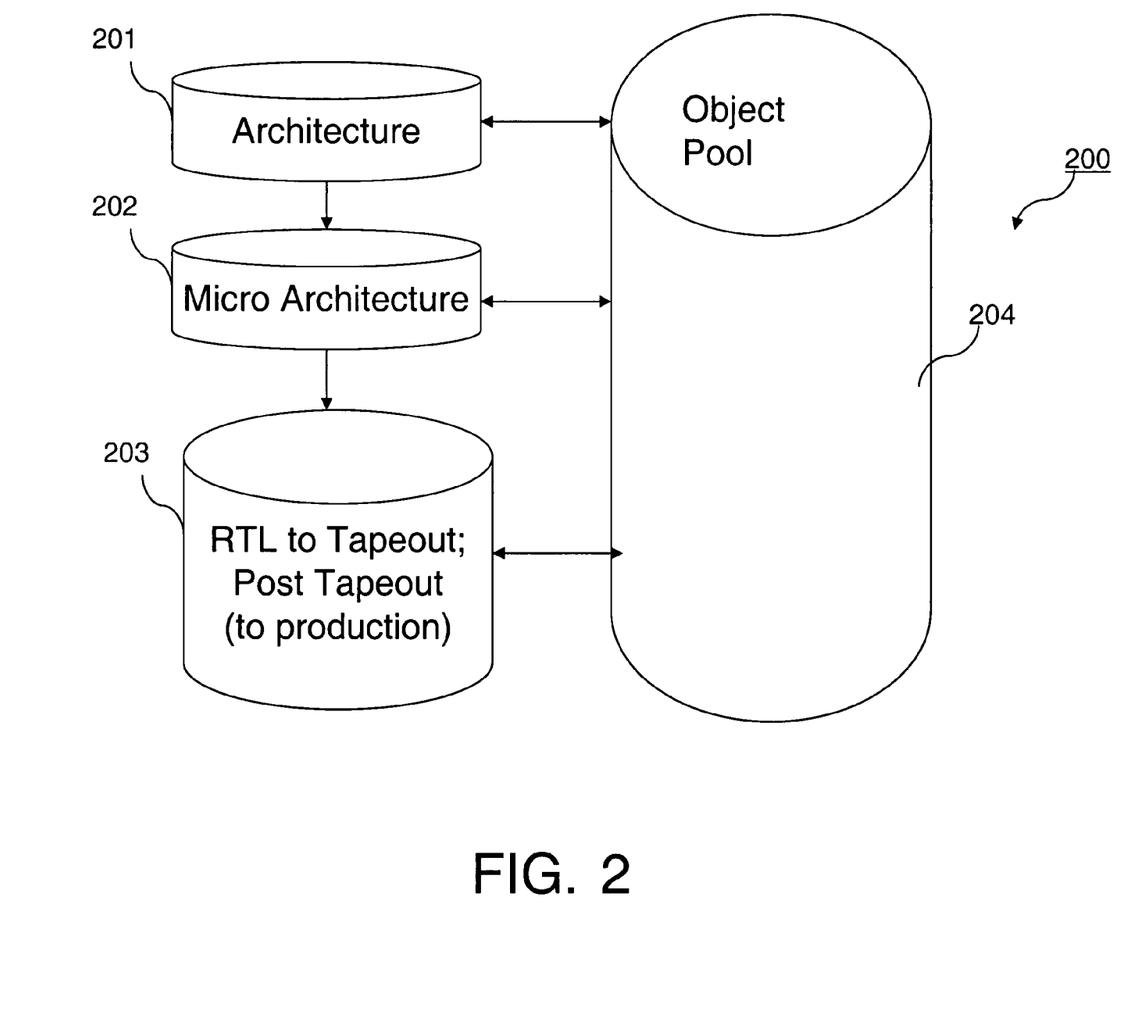
FIG. 2 is a block diagram showing an automated design process and chip description system in accordance with an embodiment of the invention.

FIG. 2 is a block diagram 200 showing an automated design process and chip description system in accordance with an embodiment of the invention. The chip description system is used to create an object pool 204 that provides a central means for the architecture 201, micro architecture 202 and RTL TO TAPEOUT 203 to share design flow information. An example of an object pool in accordance with an embodiment of the invention is described below in the discussion of FIG. 4 and FIG. 9.

Architecture 201 includes information relating to the following aspects of integrated circuit design: interfaces, functions, technology, packaging, modes, data rates, voltage domains, user objects, die size, test requirements, yield, IP (including memories), software interfaces, software/C models, performance metrics, and data sheet information.

Figure 3:
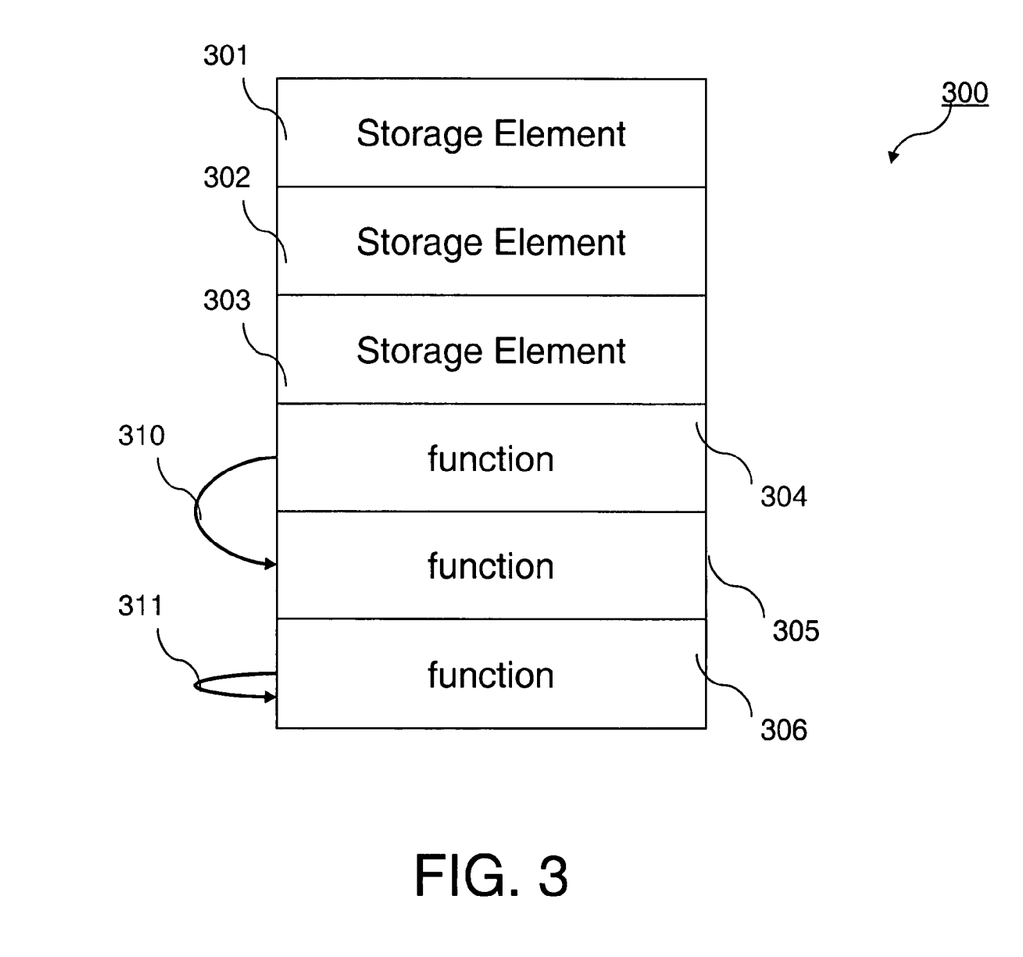
FIG. 3 is a diagram showing an example object that is used in accordance with an embodiment of the invention.

FIG. 3 is a diagram showing an example object 300 that is used in accordance with an embodiment of the invention. An object 300 includes data fields and methods. In an example embodiment of the invention, object 300 includes a plurality of data fields shown as storage elements 301-303 and a plurality of methods shown as functions 304-306. An object 300 can have any number of storage elements and functions.

Figure 9:
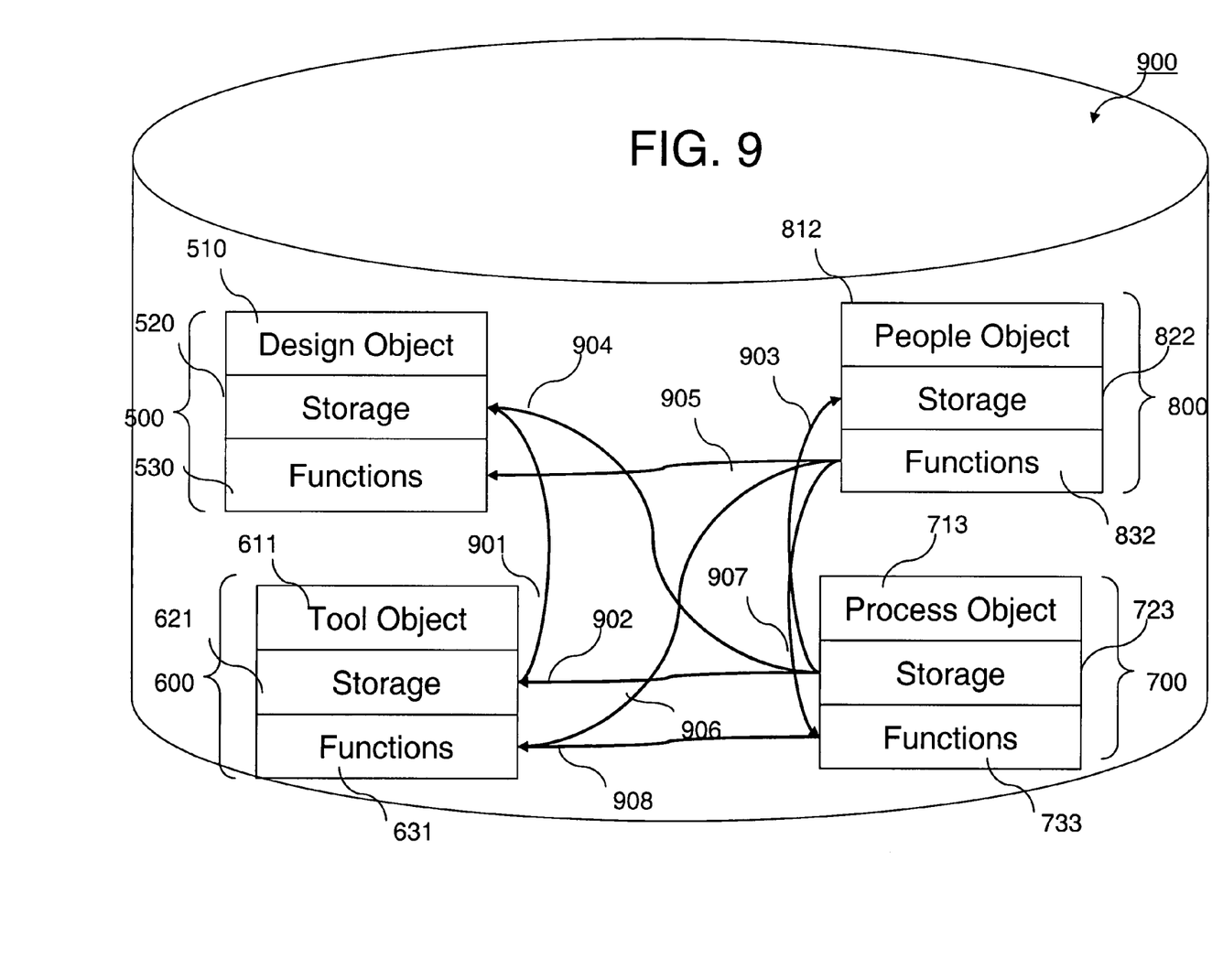
FIG. 9 is a diagram showing an example object pool and interactions among objects in accordance with an embodiment of the invention.

Methods, also called functions, and are declared in the same way as procedures or functions are declared. Methods can be used to create, modify and/or query the data field in the object containing the method or in another object. Methods can be called in a number of ways. For example, a method 304 contained in object 300 can call another method 305 contained within the same object 300, as shown by arrow 310. A method 306 can also call itself recursively, as shown by arrow 311. In FIG. 9, a method contained in object is shown calling a method contained in a different object.

Figure 4:
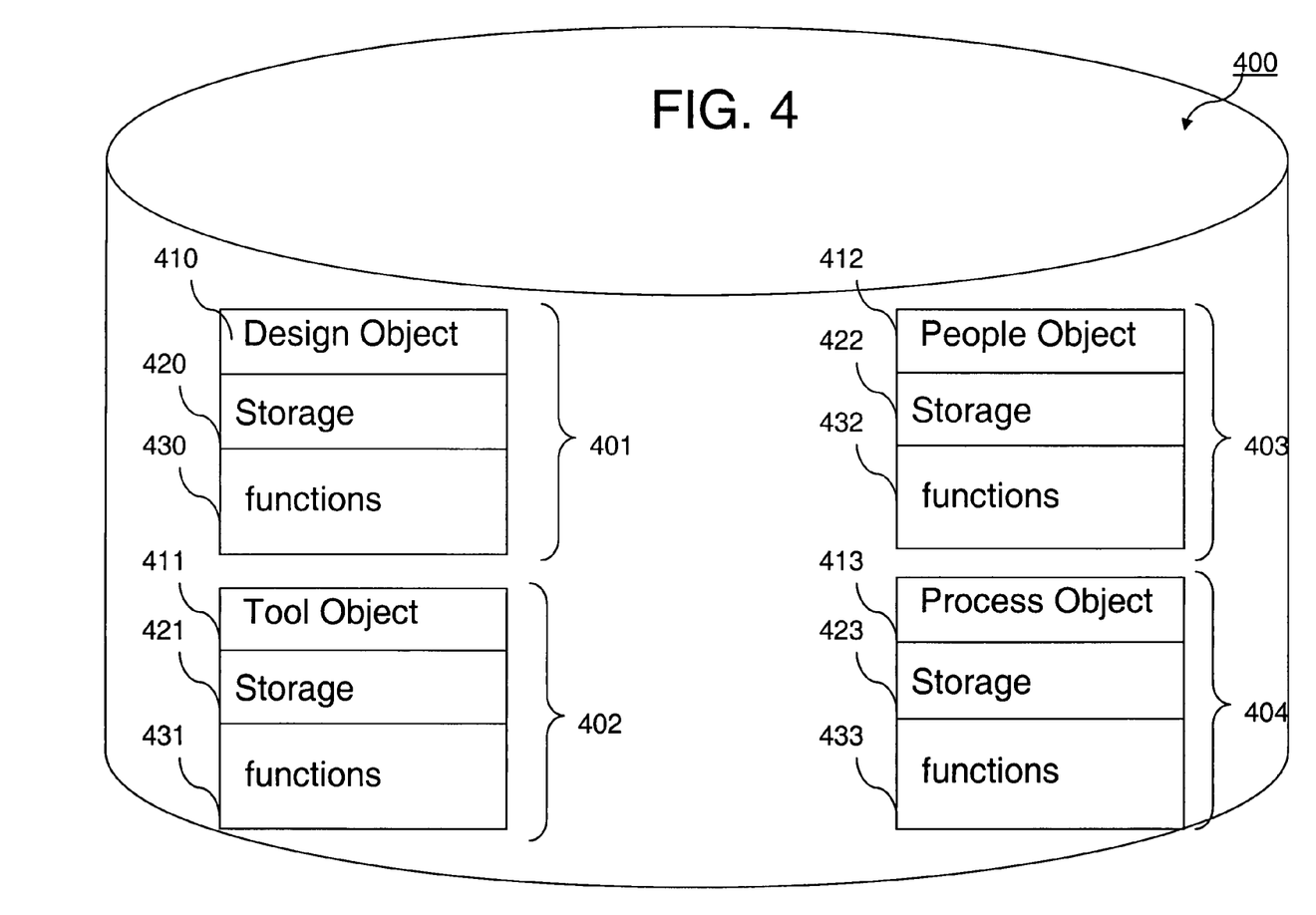
FIG. 4 is a diagram showing an example object pool and associated objects in accordance with an embodiment of the invention.

FIG. 4 is a diagram showing an example object pool 400 and associated objects 401-404 in accordance with an embodiment of the invention. Design object 401 having an object name 410 includes storage elements 420 and methods 430. Tool object 402 having an object name 411 includes storage elements 421 and methods 431. People object 403 having an object name 412 includes storage elements 422 and methods 432. Process object 404 having an object name 413 includes storage elements 423 and methods 433. Numerous additional object types can be created in accordance with embodiments of the invention. Thus, the object types listed (design, tool, people, process) should not be construed as limiting the objects to these types.

Figure 5:
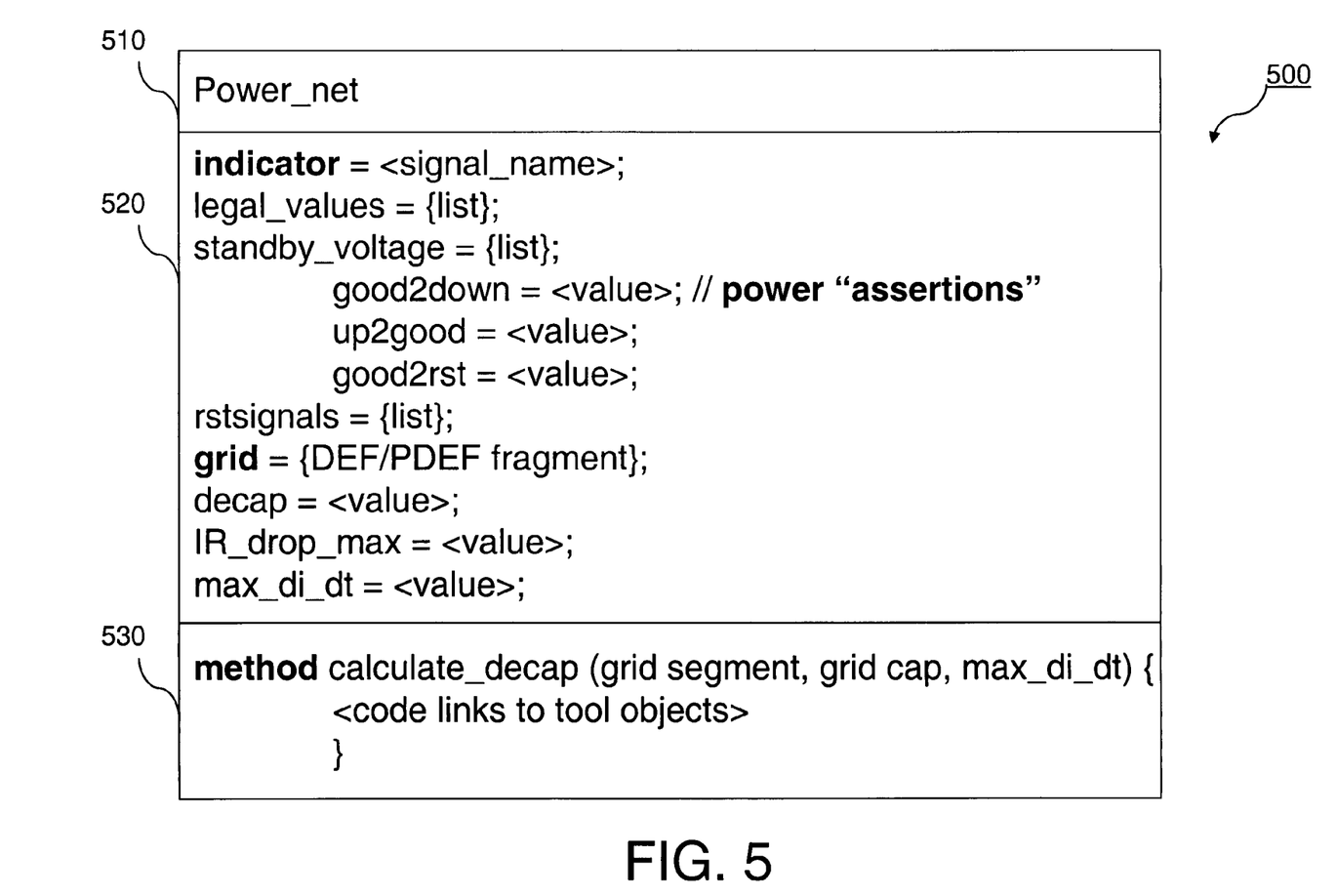
FIG. 5 is a diagram showing an example of a design object in accordance with an embodiment of the invention.

FIG. 5 is a diagram showing an example of a design object 500 in accordance with an embodiment of the invention. Design object 500 has the name "power_net" 510 and includes the storage elements 520 as shown. The storage elements include information about an indicator (shown as a signal name), a grid (shown as a DEF/PDEF fragment), and various power assertions that include a plurality of values in a list referred to as "standby_voltage." One method 530 called "calculate_decap" is shown, and includes code links to tool objects.

Figure 6:
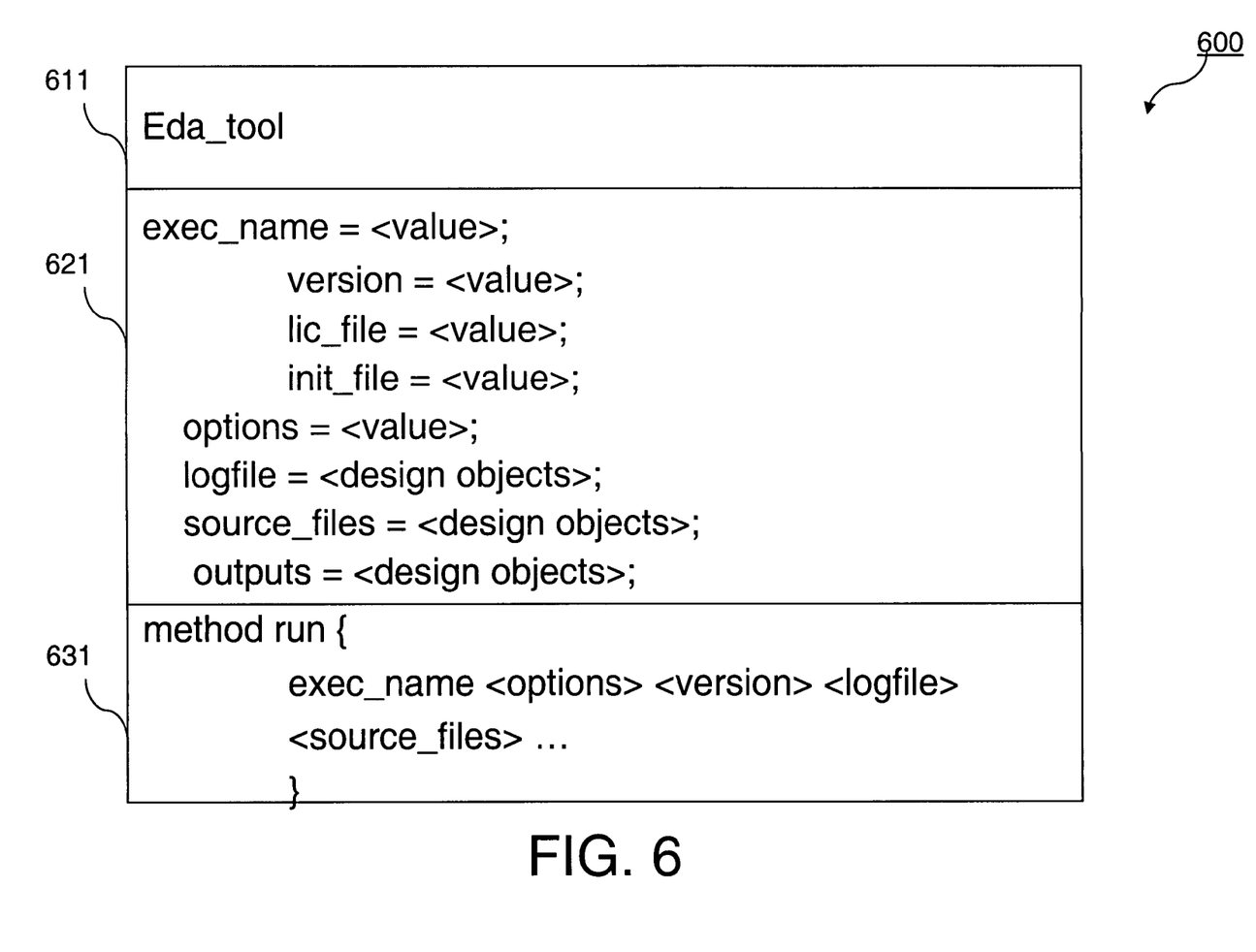
FIG. 6 is a diagram showing an example of a tool object in accordance with an embodiment of the invention.

FIG. 6 is a diagram showing an example of a tool object 600 in accordance with an embodiment of the invention. Tool object 600 has the name "eda_tool" 611 and includes storage elements 621 and methods 631. The storage elements 621 include a plurality of variables with different values, and also includes links to design objects, shown as "logfile", "source_files" and "outputs." The methods portion 631 includes the "run" method which includes links to "logfile", "source_files" and "outputs."

Figure 7:
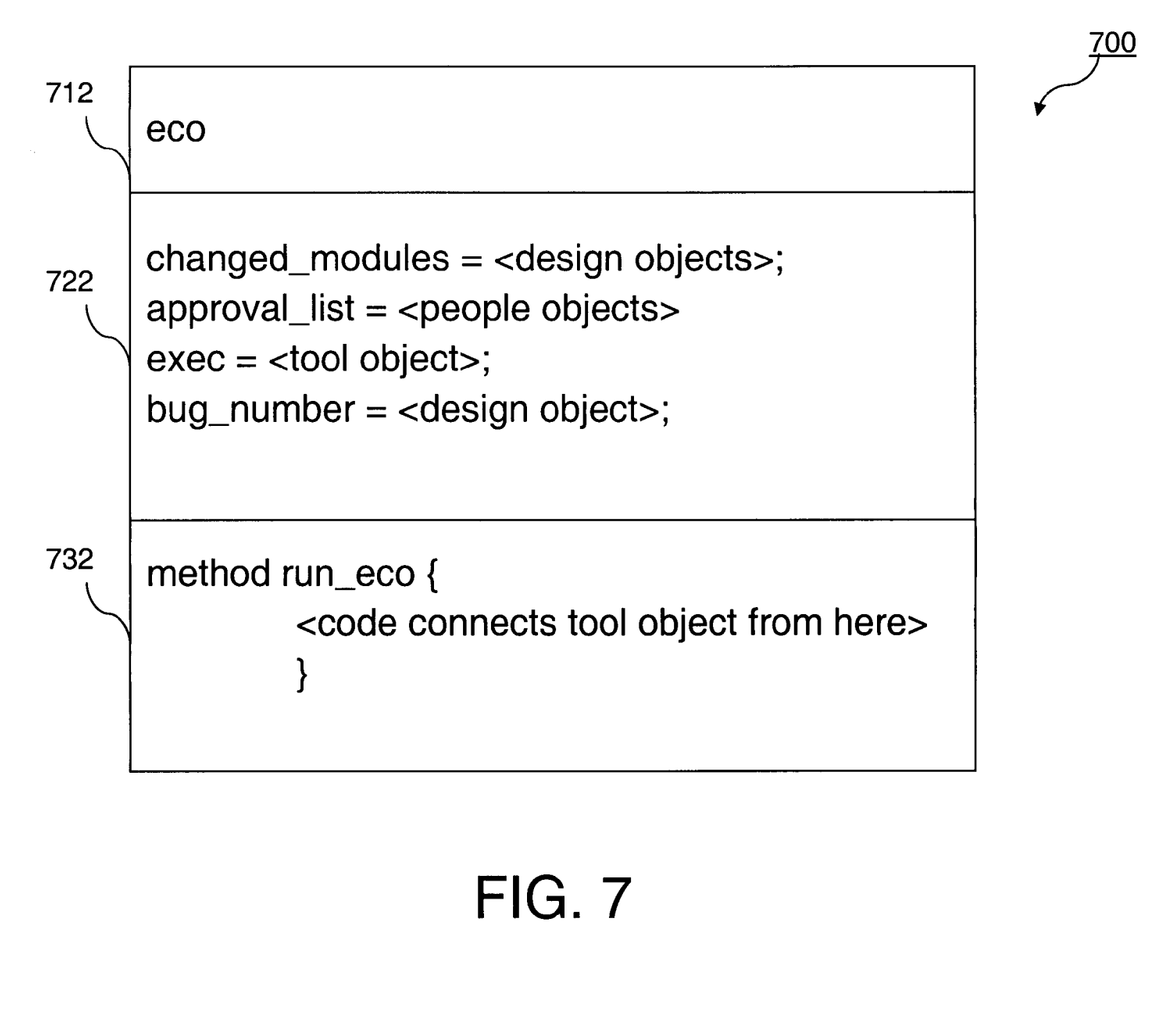
FIG. 7 is a diagram showing an example of a process object in accordance with an embodiment of the invention.

FIG. 7 is a diagram showing an example of a process object 700 in accordance with an embodiment of the invention. The process object 700 is shown as having the name "eco" 712, which refers to "engineering change order," which is a term known in the art. The eco process object 700 includes storage elements 722 and methods 732. Storage elements 722 include links to design objects (shown as "changed_modules" and "bug_number") as well as a link to a people object (shown as "approval_list") and a tool object (shown as "exec"). The method 732 is called "run_eco" and includes a link to a tool object.

Figure 8:
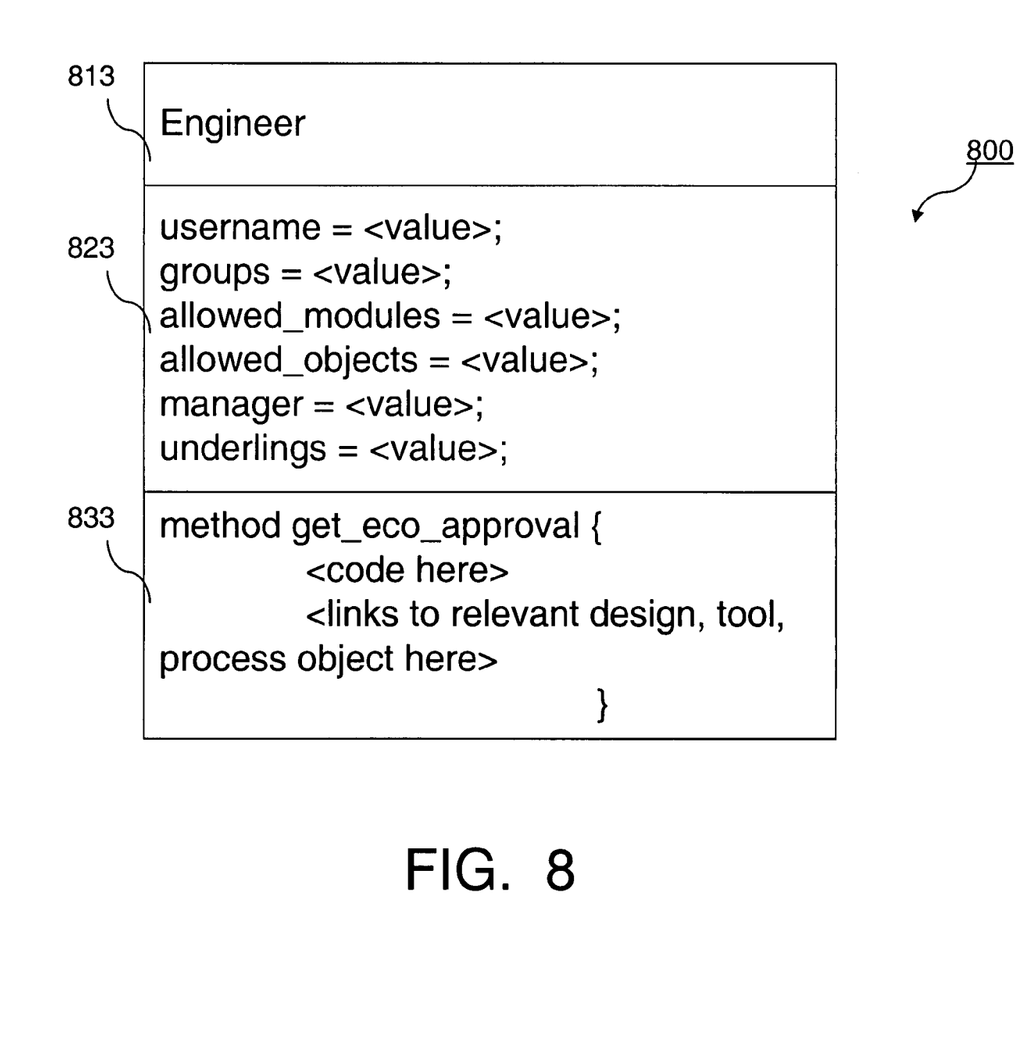
FIG. 8 is a diagram showing an example of a people object in accordance with an embodiment of the invention.

FIG. 8 is a diagram showing an example of a people object 800 in accordance with an embodiment of the invention. This people object 800 is shown as having the name "engineer" 813 because it is meant to be representative of an engineer on a design project. The people object 800 includes storage elements 823 and methods 833. The storage elements 833 include a plurality of variables that are assigned values as shown. The method 833 is shown as "get_eco_approval" and includes the code for implementing the method and a plurality of links to relevant design, tool and process objects.

FIG. 9 is a diagram showing an example object pool 900 and interactions among objects 500, 600, 700 and 800 in accordance with an embodiment of the invention. For example, arrows 901-904 show links from the storage section of one object to the storage section of another object. Arrow 901 refers to links from tool object 600 to design object 500 that are created by the storage elements "logfile," "source_files" and "outputs" in tool object 600. Arrow 902 refers to the links from process object 700 to tool object 600 that are created by the storage element "exec" in process object 700. Arrow 903 refers to the links from process object 700 to people object 800 that are created by storage element "approval_list" in process object 700. Arrow 904 refers to the links from process object 700 to design object 500 that are created by storage elements "changed_modules" and "bug_number" in process object 700.

Arrows 905-908 show links from the method section of one object to the method section of another object. Recursive links and links within one object are not shown in this example but are described above in the discussion of FIG. 3. Arrow 905 refers to the links from people object 800 to design object 500 that are created by the method "get_eco_approval" in people object 800. Arrow 906 refers to the links from people object 800 to tool object 600 that are created by the method "get_eco_approval" in people object 800. Arrow 907 refers to the links from people object 800 to process object 700 that are created by the method "get_eco_approval" in people object 800. Arrow 908 refers to the links from process object 700 to tool object 600 that are created by the method "run_eco" in process object 700. The foregoing described embodiments of the invention are provided as illustrations and descriptions. They are not intended to limit the invention to the precise form described. In particular, it is contemplated that functional implementations of the invention described herein may be implemented equivalently in hardware, software, firmware, and/or other available functional components or building blocks, and that networks may be wired, wireless, or a combination of wired and wireless. Other variations and embodiments are possible in light of the above teachings. This, it is intended that the scope of invention is not limited by this Detailed Description, but rather by the following Claims.

I claim:

1. An automated design process, comprising steps of:
creating a plurality of design objects;
processing a design definition in accordance with a plurality of design objects; and
generating a modified design output such that communication between the plurality of design process steps is seamless;
wherein the modified design output includes a plurality of non-physical attributes, including cost criteria and scheduling criteria.

2. The automated design process of claim 1, wherein the modified design output includes a plurality of physical attributes.

3. The automated design process of claim 2, wherein the plurality of physical attributes include electrical characteristics.

4. The automated design process of claim 2, wherein the plurality of physical attributes include mechanical characteristics.

5. The automated design process of claim 2, wherein the plurality of physical attributes include thermal characteristics.

6. The automated design process of claim 2, wherein the plurality of physical attributes include packaging characteristics.

7. The automated design process of claim 2, wherein the plurality of physical attributes include manufacturing characteristics.

8. The automated design process of claim 1, wherein the modified design output includes a plurality of architectural objects.

9. The automated design process of claim 1, wherein the modified design output includes a plurality of micro-architectural objects.

10. The automated design process of claim 1, wherein the modified design output is a transparent user-creatable object space.

11. The automated design process of claim 10, wherein the transparent user-creatable object space provides a means for communicating with a plurality of design database objects, such that design process customization is improved.

12. The automated design process of claim 10, wherein the transparent user-creatable object space includes a plurality of predefined complex design objects, the predefined complex design objects being applied in a consistent manner across an integrated circuit development cycle.

13. The automated design process of claim 12, wherein the plurality of predefined complex design objects include clocks.

14. The automated design process of claim 12, wherein the plurality of predefined complex design objects include test structures.

15. The automated design process of claim 12, wherein the plurality of predefined complex design objects include interfaces.

16. The automated design process of claim 12, wherein the plurality of predefined complex design objects include power wells.

17. The automated design process of claim 12, wherein the plurality of predefined complex design objects include power (voltage) islands.

18. The automated design process of claim 12, wherein the plurality of predefined complex design objects include current information.

19. The automated design process of claim 1, wherein the step of generating a modified design output is adjustable in accordance with a plurality of predefined workflow parameters.

20. The automated design process of claim 1, wherein the step of generating a modified design output is adjustable in accordance with a plurality of predefined project management parameters.

21. The automated design process of claim 1, wherein the step of generating a modified design output further comprises generating a plurality of internal design elements, wherein the plurality of internal design elements are interactively coupled with one another.

22. The automated design process of claim 21, wherein the plurality of internal design elements are associated with a plurality of analytical tasks.

23. The automated design process of claim 21, wherein the plurality of internal design elements are associated with a plurality of management tasks.

24. The automated design process of claim 21, wherein the plurality of internal design elements are associated with a plurality of modification tasks.

25. A data structure for use in a chip description system, comprising:

a plurality of design objects;

a plurality of tool objects interactively coupled with the design objects;

a plurality of process objects interactively coupled with the tool objects and the design objects;

a plurality of people objects interactively coupled with the plurality of process objects, the plurality of design objects and the plurality of tool objects, wherein the interactive coupling provides improved data management for a plurality of design files.

* * * * *